(12) United States Patent
Kruck

(10) Patent No.: US 7,061,316 B2
(45) Date of Patent: Jun. 13, 2006

(54) HIGH FREQUENCY POWER DETECTOR WITH DBM-LINEAR CHARACTERISTIC AND METHOD OF REGULATING THE POWER OF AN ELECTRICAL HF-OSCILLATION

(75) Inventor: Achim Kruck, Pfedelbach (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 10/741,986

(22) Filed: Dec. 19, 2003

(65) Prior Publication Data

US 2004/0135628 A1 Jul. 15, 2004

(30) Foreign Application Priority Data

Dec. 23, 2002 (DE) .................. 102 60 749

(51) Int. Cl.
*H03G 3/20* (2006.01)

(52) U.S. Cl. ........................ 330/140; 330/302

(58) Field of Classification Search ........... 330/140, 330/302
See application file for complete search history.

(56) References Cited

U.S. PATENT DOCUMENTS

| | | | |
|---|---|---|---|
| 5,434,537 A * | 7/1995 | Kukkonen | ............ 330/2 |
| 5,448,770 A | 9/1995 | Hietala et al. | |
| 6,069,528 A * | 5/2000 | Kashima | ............ 330/53 |
| 6,084,920 A * | 7/2000 | Ferdinandsen | ............ 375/297 |
| 6,262,630 B1 * | 7/2001 | Eriksson | ............ 330/129 |
| 6,265,939 B1 | 7/2001 | Wan et al. | |
| 6,369,635 B1 * | 4/2002 | Weiss et al. | ............ 327/330 |
| 6,429,603 B1 * | 8/2002 | Tsugita et al. | ............ 315/224 |
| 6,597,228 B1 | 7/2003 | Reichel | |

FOREIGN PATENT DOCUMENTS

| | | |
|---|---|---|
| DE | 1563406 | 7/1970 |
| DE | 2823819 | 6/1980 |
| DE | 4214350 | 8/1993 |
| DE | 69002109 | 2/1994 |
| DE | 4243481 | 3/1994 |
| DE | 4411733 | 11/1994 |
| DE | 19913338 | 9/2000 |

OTHER PUBLICATIONS

Taschenbuch der Hochfrequenztechnik ("Handbook of High Frequency Technology"), K. Lange et al., Springer-Verlag, 5th edition, vol. 1, p. G32.

* cited by examiner

*Primary Examiner*—Patricia Nguyen
(74) *Attorney, Agent, or Firm*—W. F. Fasse; W. G. Fasse

(57) ABSTRACT

A high frequency power detector includes an input coupling arrangement that couples an electrical HF-oscillation into a basic circuit portion including at least a first diode and a circuit node. The power detector further includes a series circuit of a resistor and a second diode connected to the circuit node, as well as a voltage tapping arrangement for detecting or tapping the voltage drop across the second diode as an output signal. The voltage at the circuit node includes a DC component that depends on the power of the HF-oscillation. The output signal, i.e. the voltage drop of the second diode, has a linear voltage characteristic relative to the HF-power in dBm. A method of regulating the HF-power uses such a dBm-linear HF-power detector in a feedback loop for regulating the gain factor of an HF-amplifier.

23 Claims, 2 Drawing Sheets

HIGH FREQUENCY POWER DETECTOR WITH DBM-LINEAR CHARACTERISTIC AND METHOD OF REGULATING THE POWER OF AN ELECTRICAL HF-OSCILLATION

PRIORITY CLAIM

This application is based on and claims the priority under 35 U.S.C. §119 of German Patent Application 102 60 749.4, filed on Dec. 23, 2002, the entire disclosure of which is incorporated herein by reference.

FIELD OF THE INVENTION

The invention relates to a high frequency (HF) power detector with a linear characteristic in dBm, including an input coupling arrangement for coupling-in an electrical HF-oscillation. The invention further relates to a method of regulating the power of an electrical HF-oscillation using such a high frequency power detector.

BACKGROUND INFORMATION

A high frequency power detector and a power regulation method of the general type mentioned above, forming the field of this invention, is disclosed in U.S. Pat. No. 6,265,939 (Wan et al.).

This Patent discloses a power regulation method in which the power is detected and used as an input signal for the power regulating circuit. In the scope of such a power regulation, it is desirable that the input signal varies linearly with the power detected in dBm.

As is generally known, the dimensionless power designation "dBm" is defined as the ten-fold common or base ten logarithm of the power in mW normalized to a reference power of 1 mW. In other words, "dBm" refers to decibels above 1 milliwatt, and defines a measure of power equal to ten times the common logarithm of a ratio of a given power relative to 0.001 watt. Thus, for example, a power of 20 mW can also be designated or identified by the value 13 dBm. Thus, the term "dBm linear high frequency power detector" is understood to mean a detector of which the output signal varies linearly with respect to the power of the high frequency (HF) oscillation which is scaled or designated in dBm.

The high frequency power detector known from the U.S. Pat. No. 6,265,939 comprises a rectifying diode (D1), which produces a DC voltage that is dependent on the high frequency voltage coupled to the rectifying diode through a capacitor. According to the Patent, the DC voltage varies linearly with respect to the HF-power in dBm, at lower powers. However, at higher power levels, a non-linearity in this relationship arises, which must be compensated for. To achieve this, the Patent provides additional circuit stages which add additional incremental loads into the signal processing at various increased HF-power levels. In this regard, the additive incremental loads must be dimensioned so that the output signal of the HF-power detector varies linearly with the HF-power output in dBm. The further circuit parts or stages comprise a network of a DC voltage source and several passive elements, particularly six further diodes (D2 to D7), resistors (R2 to R12), and further capacitors.

The known circuit according to U.S. Pat. No. 6,265,939 is disadvantageous because it requires an active voltage source and a relatively large number of passive components. For this reason, the known circuit can only be realized with a relatively high production effort and expense. Moreover, the great number of necessary components requires a relatively large surface area of the circuit, which is especially disadvantageous in connection with an integration of such a circuit on a single chip.

High frequency power detectors based on diodes generally provide an output voltage, which, depending on the magnitude of the coupled-in high frequency voltage, varies quadratically or linearly with respect to the coupled-in high frequency voltage. Since the power of the electrical high frequency oscillation determines the effective value of the coupled-in high frequency voltage, accordingly the output voltage of the high frequency power detector also varies quadratically or linearly when it is plotted over the power in mW. Since a transformation of the representation of the power values in dBm rather than mW logarithmically compresses the power scale, a representation of the output voltage over the power in dBm will exhibit an exponential characteristic. That is true for both the original linear characteristic as well as the original quadratic characteristic with respect to the power in mW.

In addition to the circuit construction according to the above mentioned U.S. Pat. No. 6,265,939, there are other known high frequency voltage-linear power detectors based on diodes, of which the output voltages must be linearized by at least one external stage. Such a linearizing stage may, for example, be embodied as a logarithmic (or logarithm-producing) operational amplifier, which requires a negative voltage, or as a microprocessor. Furthermore, a calibration process as well as a temperature compensation must also be carried out for processing and compensating the output.

SUMMARY OF THE INVENTION

In view of the above, it is an object of the invention to provide a dBm-linear high frequency power detector which does not require a calibration or an external temperature compensation, and which has a simplified circuit construction in comparison to the dBm-linear power detector according to U.S. Pat. No. 6,265,939, without active circuit components and with a reduced number of passive circuit components. Another object of the invention is to provide a method using such a simple circuit for regulating the power of an electrical high frequency oscillation. The invention further aims to avoid or overcome the disadvantages of the prior art, and to achieve additional advantages, as apparent from the present specification. The attainment of these objects is, however, not a limitation or required feature of the present invention.

The above objects have been achieved according to the invention in a high frequency power detector including an input coupling arrangement adapted to couple an input electrical HF-oscillation into a circuit portion or sub-circuit that comprises at least a first diode and a circuit node, and that is adapted to produce at the node a signal including a DC component that is dependent on the power of the input electrical HF-oscillation. Especially according to the invention, the power detector further comprises a series circuit coupled to the above mentioned node, whereby this series circuit includes a resistor and a second diode, as well as a voltage tapping or detecting arrangement or device that taps or detects the voltage drop across the second diode as an output voltage signal.

The above objects have further been achieved according to the invention in a method for regulating the power of an electrical HF-oscillation, using the power detector according to the invention in a feedback loop to monitor and regulate the output power.

In the circuit arrangement of the power detector according to the invention, the voltage present at the above mentioned circuit node corresponds to the total voltage drop across the series circuit of the resistor and the second diode. The voltage at the node, i.e. the voltage drop across the series circuit, corresponds or is proportional to the output voltage of a normal high frequency power detector. As will be described in further detail below, the partial voltage drop across the resistor in this additional series circuit depends exponentially on the value of the partial voltage drop across the second diode. As a result, the partial voltage drop across the second diode takes on values exhibiting a linear relationship or characteristic relative to the power plotted in dBm.

Thus, when the output voltage signal is tapped across the second diode, i.e. to correspond to the partial voltage drop across the second diode, the desired dBm-linear output voltage can be achieved without any active circuit components and with only two passive circuit components, namely the resistor and the second diode of the added series circuit. An equalization, compensation, or correction of the output characteristic through an additional output stage or circuit is thus not necessary. Furthermore, the addition of the simple series circuit according to the invention can easily be integrated into a single integrated circuit without any problems. The small surface area or space required by the present simple circuit represents a further advantage in the case of the integration of this circuit.

According to a preferred feature of the invention, the first diode and the second diode are of the same type or structure. In this manner, type-specific influences of the first diode on the output voltage of the high frequency power detector will be compensated by similar such influences of the second diode. More particularly, it is further preferred that both diodes are Schottky diodes. Due to their low depletion layer or junction capacitance, Schottky diodes are especially well suited for processing high frequency signals, as in the present application.

Another preferred feature of the invention is that both diodes are thermally coupled to each other, for example through any suitable thermally conductive substrate or the like. Such a thermal coupling of the diodes ensures that both diodes will always operate at the same temperature level. For this reason, temperature induced variations of the output signals of the first diode will be compensated by the second diode.

Still a further preferred feature of the invention is that both diodes are components of a single integrated circuit. An integration of both diodes on a single chip makes it possible to accommodate the additional series circuit easily while saving surface area of the circuit, and while simultaneously benefitting the thermal coupling of the two diodes, which improves the compensation of temperature influences as mentioned above.

In another preferred embodiment of the invention, the input coupling arrangement for coupling the input electrical HF-oscillation into the circuit comprises at least a first capacitor. Particularly, the use of one or more capacitors achieves a low-loss and signal-true coupling of the high frequency signal into the detector circuit. However, the invention is not limited to circuit arrangements using capacitive coupling of the input signal, but rather other forms of input coupling arrangements, for example using inductive coupling, can be provided instead or in combination according to the invention.

It is further preferred that the first circuit portion or sub-circuit comprises a peak value rectifier. Such peak value rectifiers are conventionally known in various different arrangements, configurations and embodiments, and any of such known rectifiers can be used. Such peak value rectifiers provide a voltage that is linearly dependent on the high frequency input voltage. Therefore, such a rectifier can be easily dBm-linearized according to the present invention without much circuit effort or expense, through combination with the inventive series circuit of a second diode and an additional resistor. Further preferably, the peak value rectifier comprises the first diode as well as a further (third) diode. The further diode, the first capacitor, and the high frequency voltage source form a first mesh or loop of the circuit, while the further diode, the first diode, and a smoothing capacitor form a second mesh or loop of the circuit (in the manner of a so-called Villard circuit). Such a Villard circuit represents a simple example of a suitable peak value rectifier, which, in combination with the inventive additional series circuit, will provide the desired dBm-linear characteristic of the output voltage.

Further preferably according to the invention, the series circuit of the resistor and the second diode, together with the second capacitor (i.e. the smoothing capacitor), forms a third mesh or loop of the circuit. In this case, as mentioned above, the second capacitor acts as a smoothing capacitor, which improves the DC quality or character of the voltage that is applied to the series circuit. This in turn improves the quality of the dBm-linear signal detection.

Further advantages and features of the invention are apparent from the present specification as well as the accompanying drawings. It should be understood that the various features and elements disclosed herein are not only useable in the respective particular disclosed combination, but rather the invention also covers all other combinations as well as individual provision of any one or more of the respective inventive features.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF A PREFERRED EXAMPLE EMBODIMENT AND OF THE BEST MODE OF THE INVENTION

Figure 1:
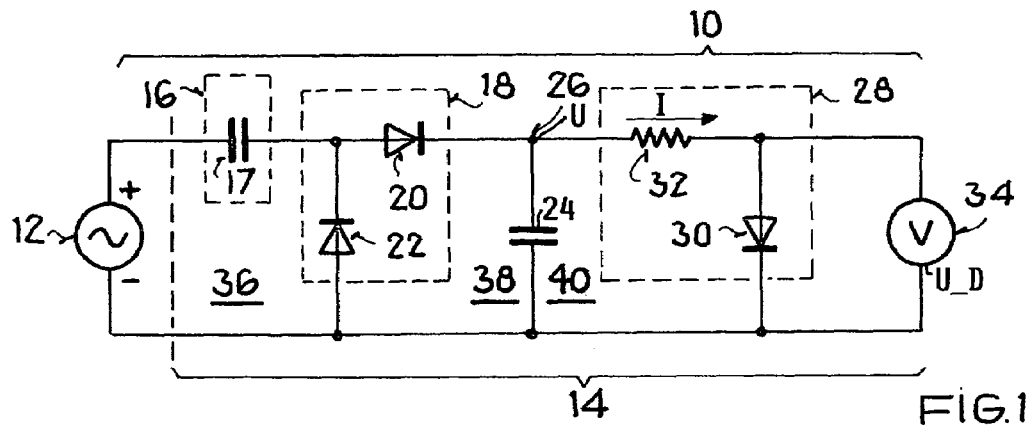
FIG. 1 is a basic schematic circuit diagram of a high frequency power detector according to the invention.

As schematically shown in FIG. 1, an overall high frequency (HF) circuit 10 includes an HF-voltage source 12 and an HF-power detector 14 according to the invention for detecting the HF-power output of the HF-voltage source 12. The HF-voltage source 12 may, for example, be realized as a collector oscillating circuit of a transistor. The inventive HF-power detector 14 comprises an input coupling arrangement 16, a peak value rectifier 18, a smoothing capacitor 24, an internal circuit node 26, a series circuit 28 forming an output stage, and a voltage tapping or detecting arrangement or means 34 such as a voltmeter or simply output terminals or taps. While it is not shown in FIG. 1, the circuit arrangement may be grounded or connected to a reference voltage at any suitable location. For example, the common conductor shown at the bottom of FIG. 1, which is connected to the negative side of the voltage source 12, could be grounded.

The input coupling arrangement 16, which comprises a first capacitor 17 in the present example embodiment, couples the HF-signal provided by the HF-voltage source 12 into a first circuit portion or sub-circuit (including the peak value rectifier 18 and the smoothing capacitor 24) of the HF-power detector 14. The peak value rectifier 18 comprises a first diode 20 and a further (third) diode 22. The rectifying effect of the peak value rectifier 18 is based on the non-linear course or progression of the diode characteristics of the diodes 20 and 22, as is generally known. Due to this exponential course or progression of the current-voltage characteristics of these diodes, the positive and negative half-waves of the input HF-signal are deformed in such a manner so that the output signal of the peak value rectifier 18 provided at the internal circuit node 26 comprises a DC component.

With sufficiently large input AC voltages, the output voltage of the peak value rectifier 18 will behave proportionally to the peak value of the input AC voltage. The smoothing capacitor 24 serves to smooth the deformed or reformed rectified AC voltage provided by the peak value rectifier 18. Thus, a smoothed AC signal comprising a DC component is provided at the internal circuit node 26.

The above described portion of the circuit arrangement 10 represents a particular rectifier circuit that is generally known as a Villard circuit. The various identified circuit components are connected together in the embodiment according to FIG. 1 in such a manner so that the HF-voltage source 12, the input coupling arrangement 16, and the further (third) diode 22 form a first mesh or loop 36 of the overall HF-circuit 10, while the further (third) diode 22, the first diode 20, and the smoothing capacitor 24 form a second mesh or loop 38 of the circuit 10. This rectifier circuit, which is known as such, provides at the internal circuit node 26, a signal with a DC component that is quadratically or linearly dependent on the input HF-voltage. When using a peak value rectifier, for example, the linear dependence prevails.

Further according to the invention, the rectifier circuit that provides the above described signal at the internal circuit node 26, is further combined with an additional series circuit 28 of a resistor 32 and a second diode 30. Thereby, in the illustrated example embodiment of FIG. 1, the resistor 32 and the second diode 30 of the series circuit 28, together with the smoothing capacitor 24, form a third mesh or loop 40 of the overall circuit 10.

In the above described circuit, the voltage prevailing at the internal circuit node 26 drives a current I through the series circuit 28 of the resistor 32 and the second diode 30. The resistor 32 and the second diode 30 form a voltage divider, so that the sum of the voltage drop U_D across the second diode 30 and the voltage drop U_R across the resistor 32 give the voltage U prevailing at the node 26. Furthermore, the voltage drop U_R across the resistor 32 is given by the product of the resistance and the current flowing therethrough, namely U_R=R·I. This current I that determines the resistor's voltage drop U_R, also flows through the second diode 30 and there causes the diode's voltage drop U_D. In view of the diode characteristic, the current I is proportional to the exponential function exp(U_D) of the voltage drop on the second diode 30. Since this same current also flows through the resistor 32, the current flowing through the resistor 32 and thus the voltage drop U_R on the resistor 32 will also be exponentially dependent on the diode voltage drop U_D.

Thus, the total voltage drop in the series circuit 28 is formed by the sum of a linear component, namely the voltage drop U_D on the second diode 30, and a term that is exponentially dependent on this voltage drop U_D, namely the voltage U_R on the resistor 32. Since the exponentially dependent term dominates the value of the above mentioned sum, the total voltage drop U on the series circuit 28 is essentially exponentially dependent on the diode voltage drop U_D. In other words, U is approximately proportional to exp(U_D), or the voltage at the internal circuit node 26 is approximately exponentially proportional to the voltage drop across the second diode 30.

Therefore, the inverse is also true, namely the voltage drop U_D on the second diode 30 is (approximately) logarithmically dependent on the voltage U prevailing at the internal circuit node 26. In other words, U_D is (approximately) proportional to Log U and thus is also proportional to the logarithm of the power of the HF-signal normalized to a reference value. This further means that the voltage drop U_D on the second diode 30 is approximately proportional to the HF-power given in dBm, within the scope of the above mentioned approximation, i.e. if the exponentially dependent term dominates the above mentioned sum of the two voltage drops on the resistor 32 and the second diode 30. The validity of this approximation can readily be ensured by appropriate selection of the circuit elements.

Figure 2:
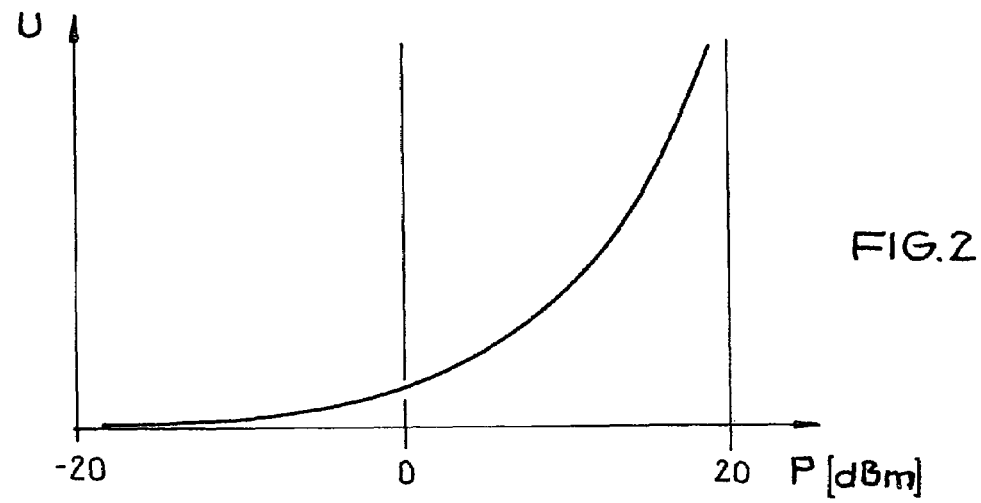
FIG. 2 is a graph of the calculated curve or progression of the voltage U relative to the power P of a high frequency signal scaled in dBm, whereby the voltage U is the voltage on an internal circuit node of the inventive detector circuit, or could be the output voltage of a conventional detector circuit.

FIG. 2 shows the calculated exponential course or progression of the voltage U relative to the HF-power P plotted in dBm. This characteristic progression of the voltage U prevails at the internal node 26 of the HF-circuit 10. The exponential nature of the voltage characteristic is apparent. If the two circuit meshes or loops 36 or 38 including the rectifier 18 and the smoothing capacitor 24 would be used directly as a power detector, with the output signal provided at the node 26, it is apparent that the output would have an exponential dependence on the HF-voltage and correspondingly the HF-power.

Figure 3:
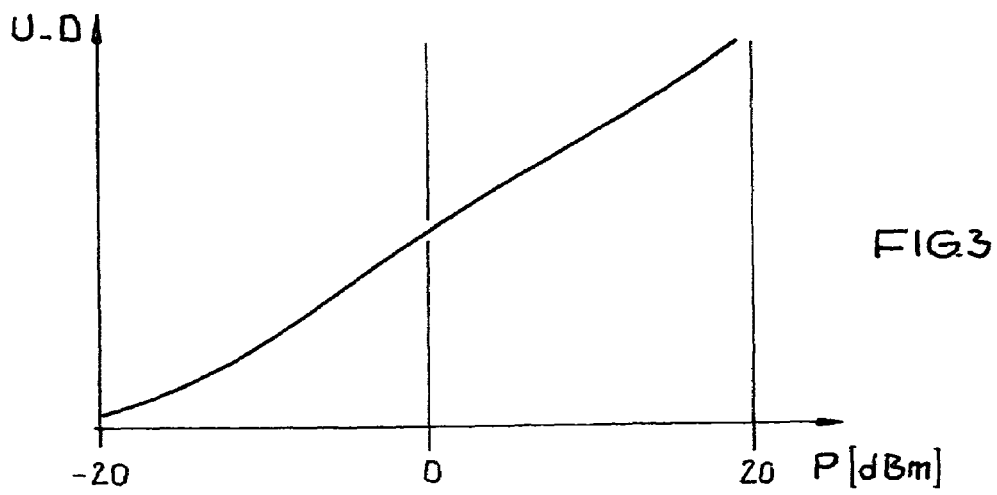
FIG. 3 is a graph of the calculated curve or progression of the output voltage U_D of the high frequency power detector according to the invention, relative to the power P of a high frequency input signal in dBm.

In comparison to FIG. 2, FIG. 3 shows a graph of the approximately linear progression of the calculated voltage drop U_D that is tapped or detected across the second diode 30, in the series circuit 28 of the resistor 32 and the second diode 30 that has been added to the overall circuit 10 according to the invention. In the illustrated example of FIG. 1, this voltage drop U_D is detected or tapped as the output signal across the second diode 30, by any suitable voltage tapping arrangement or means, such as a voltmeter 34.

The respective voltage curves illustrated in FIGS. 2 and 3 were each calculated through the use of a simulation model of the circuit according to the invention, for an HF-signal frequency of 1 GHz. The calculated results of FIGS. 2 and 3 discussed above were further qualitatively confirmed through actual measurements on real circuits. These actual measured results are illustrated in FIG. 4.

Figure 4:
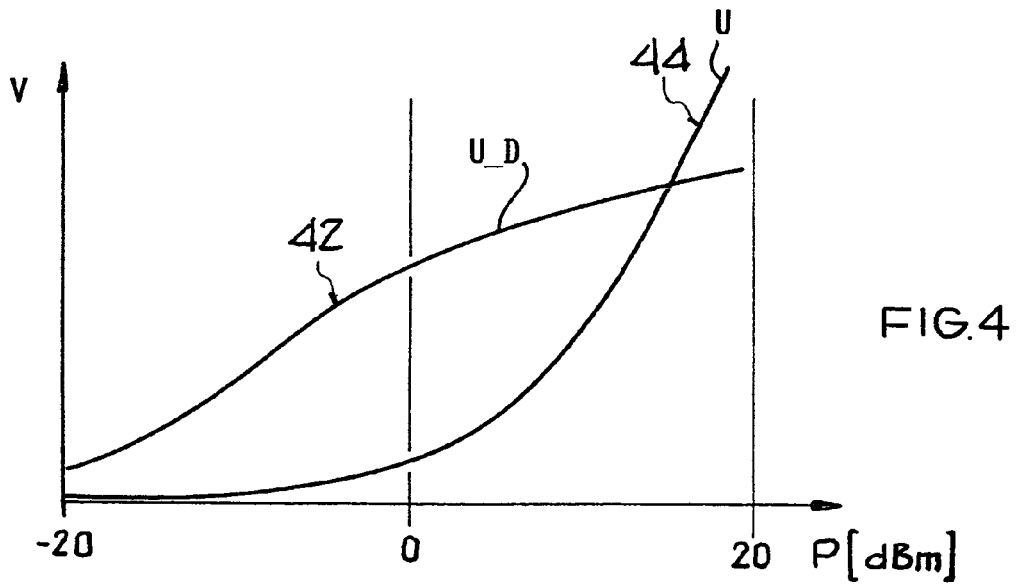
FIG. 4 is a graph of the actual measured voltage V of the internal circuit node voltage U and the output voltage U_D of an example embodiment of the inventive detector circuit.

In FIG. 4, the voltage curve 42 corresponds to the approximately linear progression of the output voltage U_D across the second diode 30. On the other hand, the voltage curve 44 represents the voltage U prevailing at the internal circuit note 26, and generally corresponds to the exponential progression of the voltage as shown by the calculated characteristic in FIG. 2.

It can be seen that the actual measured voltage curve 42 is not exactly linear. This may arise because the measurements for the qualitative testing were carried out on a circuit that was coupled to a normal HF-detector circuit. Thereby, diodes 1N4148 and 1N4004, which are not Schottky diodes, were used. Instead, when using suitable matched Schottky diodes, which are integrated on a single chip with the rest of the HF-detector circuit, it is expected that a further improved correspondence of the actual measured voltage curves with the calculated curves according to FIGS. 2 and 3 would be achieved.

Nonetheless, the actual measured U_D curve 42 shown in FIG. 4 already exhibits an approximately linear characteristic in comparison to the substantially more sharply curved and essentially exponential characteristic of the U curve 44. Namely, while the incline slope of the curve 42 is initially greater at lower power values, it then becomes smaller at higher power values (in comparison to the curve 44). Also, the slope of the curve 42 clearly fluctuates about an average value, while on the other hand the slope of the curve 44 continuously increases in a generally exponential manner. Such a characteristic of the curve 42 having a slope fluctuating about an average slope value can be understood as defining a "substantially linear" characteristic.

While the U curve 44 in the present context represents the voltage prevailing at the internal circuit node 26, it should further be understood that this voltage characteristic corresponds to the expected exponential progression or characteristic of the output voltage of a conventional HF-detector circuit using only a peak value rectifier circuit without the inventive additional series circuit 28, with respect to the power of the coupled-in HF-signal plotted in dBm, i.e. logarithmically.

Figure 5:
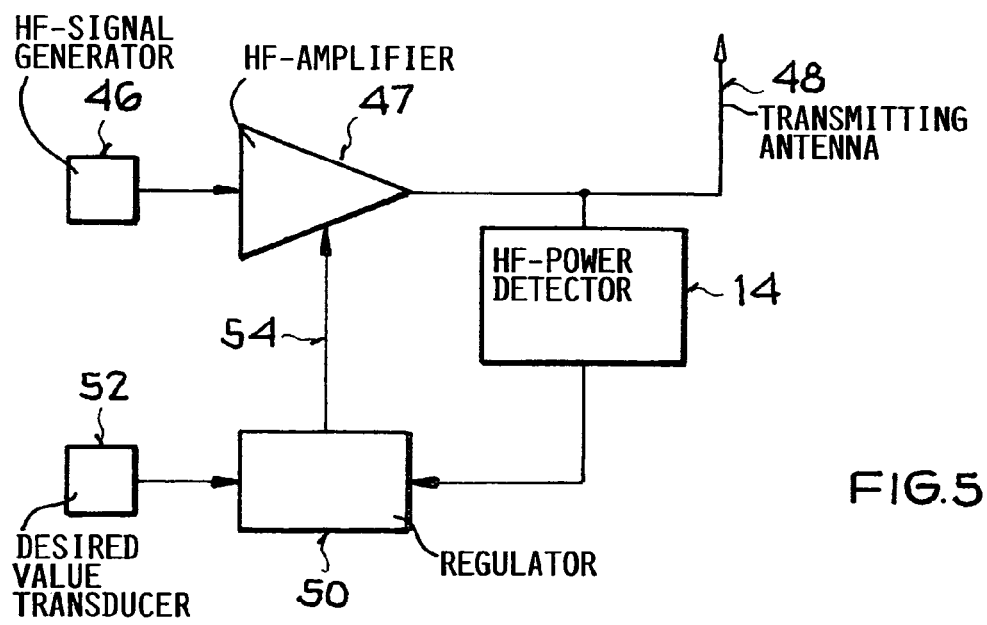
FIG. 5 is a highly schematic block circuit diagram of a regulation circuit for regulating a high frequency power using a dBm-linear power detector according to the invention.

FIG. 5 illustrates, in a strongly schematic manner, a regulation circuit for regulating a high frequency power while using a dBm-linear power detector 14 according to the invention. An HF-signal provided by an HF-signal transducer or generator 46 is provided to and amplified in an HF-amplifier 47 that has a controllable amplification or gain factor. The resulting amplified signal is, for example, radiated from an antenna 48. In order to regulate the transmitting power, a portion of the HF-signal is coupled out of the circuit path downstream from the HF-amplifier 47 and into the HF-power detector 14. This HF-power detector 14 is the inventive dBm-linear HF-power detector, which may be embodied according to FIG. 1 as described above.

The output signal of the HF-power detector 14, i.e. the voltage drop U_D over the second diode 30 of the series circuit 28 of FIG. 1, is provided as a measured actual value to a regulator 50. A nominal or desired value indicating the desired HF-power level is further provided to the regulator 50 from a nominal or desired value transducer or input 52, for example a memory cell of a regulation electronics arrangement. Based on the actual measured value and the desired or nominal value of the HF-power, for example by comparing these two values using a comparator, the regulator 50 forms an adjustment value or regulation signal, which is transmitted over a signal path 54 to the gain control input of the HF-amplifier 47, whereby the amplification or gain factor is regulated. The regulation method according to the invention thus involves the sequence of steps as just described for the operation of the regulation circuit according to FIG. 5.

In this context, the invention is based on the use of a dBm-linear HF-power detector 14 in the illustrated regulation circuit 47, 14, 50. However, the invention is not limited to the use of the particular HF-detector 14 using a Villard circuit as shown and described above in detail in connection with FIG. 1. Instead, the invention allows for the use of any desired HF-power detector based on diodes, combined with an added series circuit 28 of a resistor 32 and a second diode 30, whereby the voltage drop on the second diode 30 is detected or tapped as the dBm-linear output value or measure for the HF-power. Examples of other rectifier circuits based on diodes that can be used as the basic starting-point sub-circuit of the present inventive detector circuit include series rectifiers and full wave rectifiers embodied as center tap circuits or bridge circuits, with any conventionally known circuit arrangements. Such rectifiers are generally known to a person of ordinary skill in the art, and thus do not need to be described herein in detail. For example suitable rectifier circuits of this type are disclosed in the reference book by Meinke Gundlach, "Taschenbuch fuer Hochfrequenztechnikt" (Pocketbook for High Frequency Technology), 5th Edition, Vol. 1, ISBN 3-540-54714-2, page G32. Moreover, in addition to or instead of capacitive input coupling elements 16, 17, the circuit arrangement according to the invention could use inductive coupling elements for coupling an HF-power into the HF-power detector.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A high frequency power detector circuit arrangement comprising:
   a sub-circuit comprising a first diode and a circuit node;
   a coupling arrangement that is connected to said sub-circuit and that is adapted to couple into said sub-circuit an electrical high frequency oscillation applied to a first input terminal of said coupling arrangement;
   a series circuit that is connected to said circuit node and that comprises a resistor and a second diode connected in series with one another; and
   a voltage tapping arrangement connected to said second diode and adapted to tap or detect a voltage drop across said second diode, wherein said voltage tapping arrangement is adapted to provide an output signal indicative of said voltage drop across said second diode, which depends on and is indicative of a power of the electrical high frequency oscillation applied to said first input terminal of said coupling arrangement.

2. The high frequency power detector circuit arrangement according to claim 1, wherein said series circuit consists of said resistor and said second diode and one or more conductor paths connecting said resistor and said second diode in series with one another, and wherein said resistor and said second diode form a voltage divider between said circuit node and a downstream side of said second diode.

3. The high frequency power detector circuit arrangement according to claim 2, wherein said resistor is connected to and interposed between said circuit node and an upstream side of said second diode.

4. A high frequency power detector circuit arrangement comprising:
   a sub-circuit comprising a first diode and a circuit node;
   a coupling arrangement that is connected to said sub-circuit and that is adapted to couple into said sub-circuit an electrical high frequency oscillation applied to a first input terminal of said coupling arrangement;
   a series circuit that is connected to said circuit node and that comprises a resistor and a second diode connected in series with one another;
   a voltage tapping arrangement connected to said second diode and adapted to tap or detect a voltage drop across said second diode; and
   a common reference conductor and a second input terminal connected to said common reference conductor;
   wherein said sub-circuit and said series circuit are each further connected to said common reference conductor, and
   wherein said voltage tapping arrangement includes a first voltage output lead connected to a point that is connected and interposed between said resistor and said second diode, and a second voltage output lead connected to said common reference conductor.

5. The high frequency power detector circuit arrangement according to claim 4, further comprising a high frequency input voltage source connected to said first input terminal and said second input terminal.

6. The high frequency power detector circuit arrangement according to claim 1, wherein said sub-circuit is adapted to produce at said circuit node a signal that includes a DC signal component that is dependent on the power of the electrical high frequency oscillation.

7. A high frequency power detector circuit arrangement comprising:
   a sub-circuit that comprises a peak value rectifier circuit and includes a first diode and a circuit node;
   a coupling arrangement that is connected to said sub-circuit and that is adapted to couple into said sub-circuit an electrical high frequency oscillation applied to a first input terminal of said coupling arrangement;
   a series circuit that is connected to said circuit node and that comprises a resistor and a second diode connected in series with one another; and
   a voltage tapping arrangement connected to said second diode and adapted to tap or detect a voltage drop across said second diode.

8. The high frequency power detector circuit arrangement according to claim 7, wherein said peak value rectifier circuit comprises the first diode and a further third diode, wherein said circuit arrangement further comprises a high frequency input voltage source connected to said first input terminal and to said third diode, and wherein said third diode, said coupling arrangement and said input voltage source together form a first mesh of said circuit arrangement.

9. The high frequency power detector circuit arrangement according to claim 8, wherein said sub-circuit further comprises a smoothing capacitor, wherein said third diode, said first diode and said smoothing capacitor together form a second mesh of said circuit arrangement with said circuit node between said first diode and said smoothing capacitor.

10. The high frequency power detector circuit arrangement according to claim 9, wherein said smoothing capacitor, said resistor and said second diode together form a third mesh of said circuit arrangement.

11. The high frequency power detector circuit arrangement according to claim 1, adapted so that said output signal varies substantially linearly with respect to the power of the electrical high frequency oscillation represented in dBm.

12. The high frequency power detector circuit arrangement according to claim 1, wherein said first and second diodes are both of the seine diode type.

13. The high frequency power detector circuit arrangement according to claim 1, wherein said first and second diodes are both respective Schottky diodes.

14. The high frequency power detector circuit arrangement according to claim 1, wherein said first and second diodes are thermally coupled to each other.

15. The high frequency power detector circuit arrangement according to claim 1, wherein said circuit arrangement comprises an integrated circuit, and said first and second diodes are both integrated into said integrated circuit.

16. A high frequency power detector circuit arrangement comprising:
   a sub-circuit comprising a first diode and a circuit node;
   a coupling arrangement that comprises an input coupling capacitor and that is connected to said sub-circuit and that is adapted to couple into said sub-circuit an electrical high frequency oscillation applied to a first input terminal of said coupling arrangement;
   a series circuit that is connected to said circuit node and that comprises a resistor and a second diode connected in series with one another; and
   a voltage tapping arrangement connected to said second diode and adapted to tap or detect a voltage drop across said second diode.

17. The high frequency power detector circuit arrangement according to claim 1, expressly excluding active elements and including only passive elements.

18. The high frequency power detector circuit arrangement according to claim 1, further comprising:
   a high frequency variable gain amplifier with an output connected to said first input terminal and adapted to apply the electrical high frequency oscillation thereto;
   a high frequency signal generator connected to an input of said amplifier;
   a desired value transducer; and
   a regulator having a desired value input connected to said desired value transducer, and having an actual measured value input connected to said voltage tapping arrangement, and having a control signal output connected to a gain control input of said amplifier.

19. A method of regulating the power of an electrical high frequency oscillation using the circuit arrangement according to claim 1, comprising the steps:
   a) generating said high frequency oscillation and applying said high frequency oscillation to said first input terminal;
   b) detecting said voltage drop across said second diode; and
   c) regulating said power responsive to and dependent on said voltage drop.

20. A high frequency power detector circuit arrangement comprising:
   a first input terminal and a second input terminal;
   an input coupling arrangement comprising at least one of a coupling capacitor and a coupling inductor connected to said first input terminal;
   a rectifier arrangement connected to said input coupling arrangement, said second input terminal, and a circuit node;
   a series circuit including a resistor and a diode connected in series between said circuit node and said second input terminal; and
   first and second output terminals respectively connected to opposite sides of said diode.

21. The high frequency power detector circuit arrangement according to claim 20, further comprising a smoothing capacitor connected parallel to said series circuit between said circuit node and said second input terminal.

22. The high frequency power detector circuit arrangement according to claim 20, wherein said resistor is connected to said circuit node and said diode is connected in a forward feed direction from said resistor to said second input terminal.

23. The high frequency power detector circuit arrangement according to claim 20, wherein said rectifier arrangement comprises a first rectifier diode connected in a forward feed direction from said input coupling arrangement to said circuit node, and a further rectifier diode connected in a forward feed direction from said second input terminal to said input coupling arrangement and said first rectifier diode.

* * * * *

UNITED STATES PATENT AND TRADEMARK OFFICE
CERTIFICATE OF CORRECTION

PATENT NO. : 7,061,316 B2  
APPLICATION NO. : 10/741986  
DATED : June 13, 2006  
INVENTOR(S) : Kruck Page 1 of 1

It is certified that error appears in the above-identified patent and that said Letters Patent is hereby corrected as shown below:

Column 1,
Line 42, after "term", replace ""dBm linear" by --"dBm-linear--;

Column 8,
Line 27, before "(Pocketbook", replace "quenztechnikt" by --quenztechnik--;

Column 10,
Line 5, after "the", replace "seine" by --same--.

Signed and Sealed this

Nineteenth Day of December, 2006

JON W. DUDAS
*Director of the United States Patent and Trademark Office*